United States Patent
Lee

(10) Patent No.: US 8,587,978 B2
(45) Date of Patent: Nov. 19, 2013

(54) NONVOLATILE MEMORY APPARATUS, REPAIR CIRCUIT FOR THE SAME, AND METHOD FOR READING CODE ADDRESSABLE MEMORY DATA

(75) Inventor: Sang Kyu Lee, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 384 days.

(21) Appl. No.: 12/983,170

(22) Filed: Dec. 31, 2010

(65) Prior Publication Data
US 2012/0106224 A1 May 3, 2012

(30) Foreign Application Priority Data
Oct. 29, 2010 (KR) .................. 10-2010-0106595

(51) Int. Cl.
*G11C 15/00* (2006.01)
*G11C 29/04* (2006.01)

(52) U.S. Cl.
USPC ........................ 365/49.1; 365/200

(58) Field of Classification Search
USPC ................................ 365/49.1, 200
See application file for complete search history.

(56) References Cited

U.S. PATENT DOCUMENTS

| | | | |
|---|---|---|---|
| 6,883,044 B1 | 4/2005 | Roohparvar | |
| 7,092,289 B1 | 8/2006 | Wong | |
| 7,246,346 B2 | 7/2007 | Demsey et al. | |
| 2003/0035322 A1 | 2/2003 | Wong | |
| 2005/0162912 A1 | 7/2005 | Roohparvar | |
| 2009/0238005 A1* | 9/2009 | You ........................ | 365/185.18 |

FOREIGN PATENT DOCUMENTS

KR    10-2010-0115123 A    10/2010

* cited by examiner

*Primary Examiner* — Hoai V Ho
*Assistant Examiner* — Tri Hoang
(74) *Attorney, Agent, or Firm* — William Park & Associates Patent Ltd.

(57) ABSTRACT

A nonvolatile memory apparatus includes: a memory cell array including a plurality of planes and configured to store a plurality of code addressable memory (CAM) data in independent planes. A redundancy cell array is configured to replace the memory cell array and a CAM data read unit is configured to read the plurality of CAM data from the respective planes in parallel, in response to a CAM data read command, and store the read data.

14 Claims, 4 Drawing Sheets

NONVOLATILE MEMORY APPARATUS, REPAIR CIRCUIT FOR THE SAME, AND METHOD FOR READING CODE ADDRESSABLE MEMORY DATA

CROSS-REFERENCES TO RELATED APPLICATION

The present application claims priority under 35 U.S.C. §119(a) to Korean application number 10-2010-0106595, filed on Oct. 29, 2010, in the Korean Intellectual Property Office, which is incorporated herein by reference in its entirety.

BACKGROUND

1. Technical Field

The present invention relates to a semiconductor integrated circuit, and more particularly, to a nonvolatile memory apparatus, a repair circuit for the same, and a method for reading code addressable memory (CAM) data.

2. Related Art

A nonvolatile memory apparatus represented by a flash memory apparatus has advantages in that it may freely record and erase data and conserve data stored therein even though power supply is cut off. Thus, the nonvolatile memory apparatus has been recently adopted as a storage medium for a variety of digital devices.

Such a nonvolatile memory apparatus adopts a repair method in which main memory cells and redundancy memory cells are used together, in order to improve the yield. In the repair method, when a defect exists in a main memory cell, the main memory cell is replaced by a redundancy memory cell. In order to repair a memory cell in which a defect occurs, repair address information, column address information in which the memory cell having a defect is included, input/output port address information and so on need to be stored in a separate storage unit.

Conventionally, repair information has been stored by using a fuse. In such a repair method using a fuse, the repair information is stored by fuse cutting, before a nonvolatile memory apparatus is packaged. Therefore, after the packaging is completed, the repair information cannot be updated.

Recently, repair information has been stored in a CAM. In such a repair method using a CAM, a specific block of a memory cell array including a plurality of blocks is allocated as a CAM cell block to store repair address information or option information as CAM data.

CAM data includes CAM setting data CAMDATA_LOG such as internal bias information or internal logic setting information, redundancy address information CAMDATA_RED, and bad block information CAMDATA_BAD. Such CAM data is read from a corresponding storage area at every normal operation of a nonvolatile memory and stored in a latch of a repair circuit.

FIG. 1 is a timing diagram explaining a conventional method for reading CAM data.

As a normal operation of a nonvolatile memory apparatus starts, a log data load signal CAMLOG_LOAD is asserted, and thus CAM log data CAMDATA_LOG is stored in a latch according to a designated address. When the storing of the CAM log data CAMDATA_LOG is completed, a redundancy address information load signal CAMRED_LOG is asserted to store redundancy address information CAMDATA_RED in a designated address area of the latch. Then, when a bad block information load signal CAMBAD_LOAD is asserted, the CAM bad block information CAMDATA_BAD is stored in a designated address area of the latch.

In FIG. 1, CAM_BUSY represents a CAM data read enable signal outputted from a controller, and CAMADD represents address information for storing the respective CAM data.

As such, since the respective CAM data are sequentially read and stored in the latch, a considerable amount of time is required for reading the CAM data at the initial stage of a normal operation.

Furthermore, since the operation of reading the CAM data and storing the read CAM data in the latch is performed whenever a normal operation starts, the operation may serve as a factor which determines the operation speed of the nonvolatile memory apparatus. Accordingly, there is a demand for a method capable of reducing the operation time.

SUMMARY

In one embodiment of the present invention, a nonvolatile memory apparatus includes a memory cell array including a plurality of planes and configured to store a plurality of code addressable memory (CAM) data in independent planes. A redundancy cell array is configured to replace the memory cell array and a CAM data read unit is configured to read the plurality of CAM data from the respective planes in parallel, in response to a CAM data read command, and store the read data.

In another embodiment of the present invention, there is provided a repair circuit for a nonvolatile memory apparatus including a memory cell array in which a plurality of planes is provided. A plurality of CAM data are stored in independent planes of the memory cell array, and the repair circuit receives a plurality of CAM data from the memory cell array and reads and stores the plurality of CAM data in parallel.

In another embodiment of the present invention, a method for reading CAM data includes: receiving CAM data stored in independent planes in a memory cell array. The CAM data is converted into a form of data which are to be stored in latches. A plurality of CAM data load signals corresponding to the plurality of CAM data is asserted and the converted CAM data is stored in latches at the same time.

BRIEF DESCRIPTION OF THE DRAWINGS

Features, aspects, and embodiments are described in conjunction with the attached drawings, in which.

DETAILED DESCRIPTION

Hereinafter, a nonvolatile memory apparatus, a repair circuit for the same, and a method for reading CAM data according to the present invention will be described below with reference to the accompanying drawings through exemplary embodiments.

Figure 2:
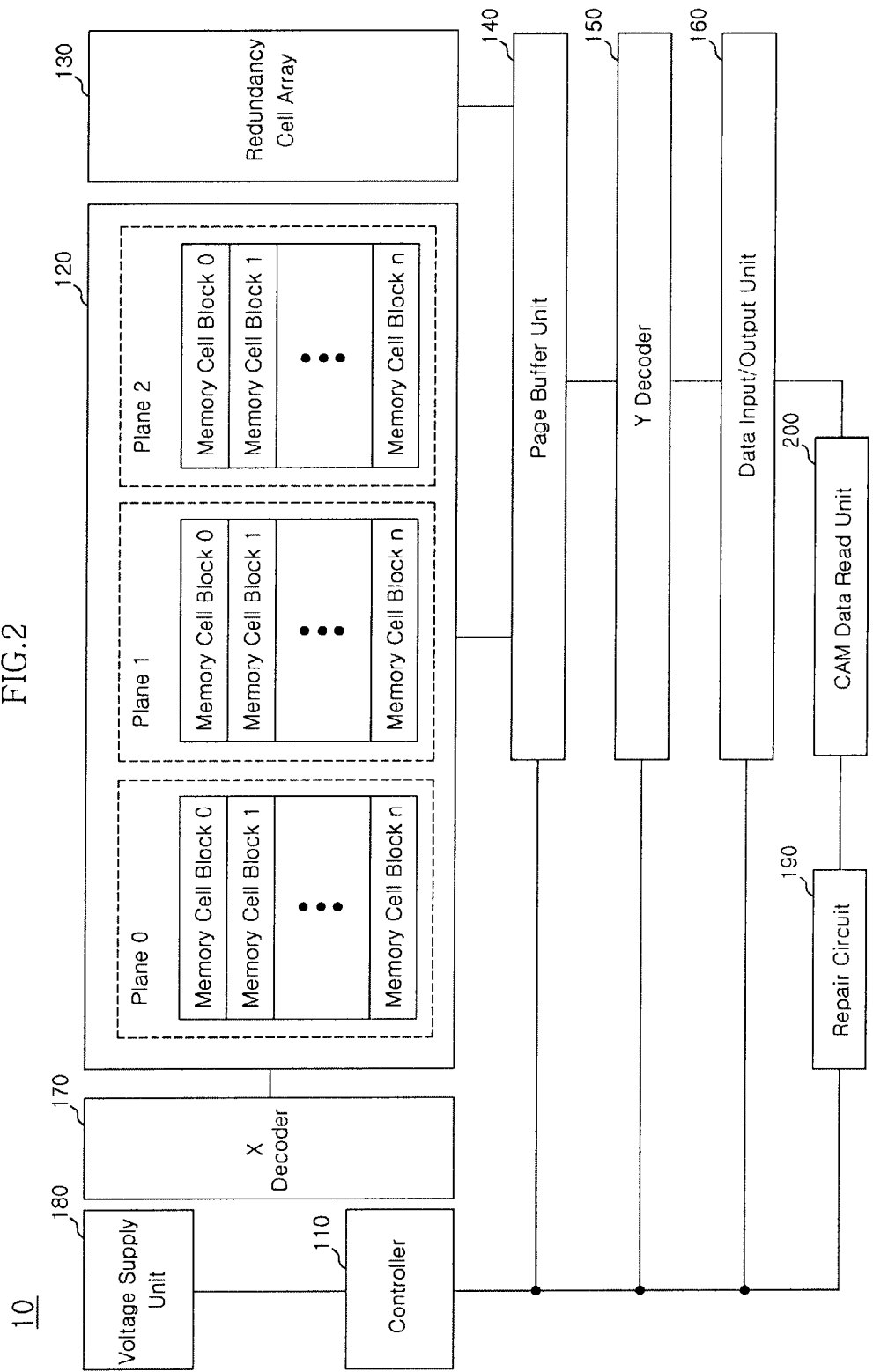
FIG. 2 is a configuration diagram of a nonvolatile memory apparatus according to one embodiment.

FIG. 2 is a configuration diagram of a nonvolatile memory apparatus according to one embodiment.

Referring to FIG. 2, the nonvolatile memory apparatus 10 according to the embodiment includes a controller 110, a memory cell array 120, a redundancy cell array 130, a page buffer unit 140, a Y decoder 150, a data input/output unit 160, an X decoder 170, a voltage supply unit 180, a repair circuit 190, and a CAM data read unit 200.

The memory cell array 120 includes a plurality of cell blocks, each of which includes a plurality of memory cells configured to store data. The plurality of cell blocks is divided into a plurality of planes. In this embodiment, CAM log data CAMLOG at a memory cell level and CAM data including CAM redundancy address information CAMRED and CAM bad block information CAMBAD may be stored in designated memory cell blocks of separate planes, respectively, or the CAM redundancy address information CAMRED and the CAM bad block information CAMBAD may be stored together in a designated memory cell block of a plane different from a plane in which the CAM log data CAMLOG is stored.

The redundancy cell array 130 includes a plurality of memory cells for replacing a memory cell of the memory cell array 120, when a defect exists in the corresponding memory cell.

The page buffer unit 140 includes a plurality of page buffer circuits which are coupled to a pair of bit lines coupled to the memory cells composing the memory cell array 120 and the redundancy cell array 130 and configured to program data into memory cells or read data stored in memory cells.

The Y decoder 150 is configured to provide an input/output path of a page buffer circuit coupled to a memory cell which is to be accessed according to inputted address information, and the X decoder 170 is configured to select a word line of a memory cell which is to be accessed according to inputted address information.

The data input/output unit 160 is configured to input data to be programmed to the page buffer unit 140 through the Y decoder 150 or output data read by the page buffer unit 140 to a data pad.

The voltage supply unit 180 is configured to generate and supply an operation voltage according to the control of the controller 110.

The CAM data read unit 200 is configured to receive CAM data including the CAM log data CAMLOG at the memory cell level, the CAM redundancy address information CAMRED, and the CAM bad block information CAMBAD through the data input/output unit 160, convert the respective CAM data into the form of data which can be stored in latches, and simultaneously store the converted data in designated latches, according to CAM data load signals generated during the same time period. The converted data include CAM log data CAMDATA_LOG, CAM redundancy address information CAMDATA_RED, and CAM bad block information CAMDATA_BAD.

The repair circuit 190 is configured to determine whether an address to be inputted together with an operation command is a repaired column address or not, by referring to the CAM data stored in the latches of the CAM data read unit 200, and output the result as a repair control signal.

In this embodiment, the CAM data read unit 200 and the repair circuit 190 are separately provided. Without being limited thereto, however, the entire CAM data read unit 200 or a latch section of the CAM data read unit 200 may be provided inside the repair circuit 190. The latch section will be described below.

Figure 3:
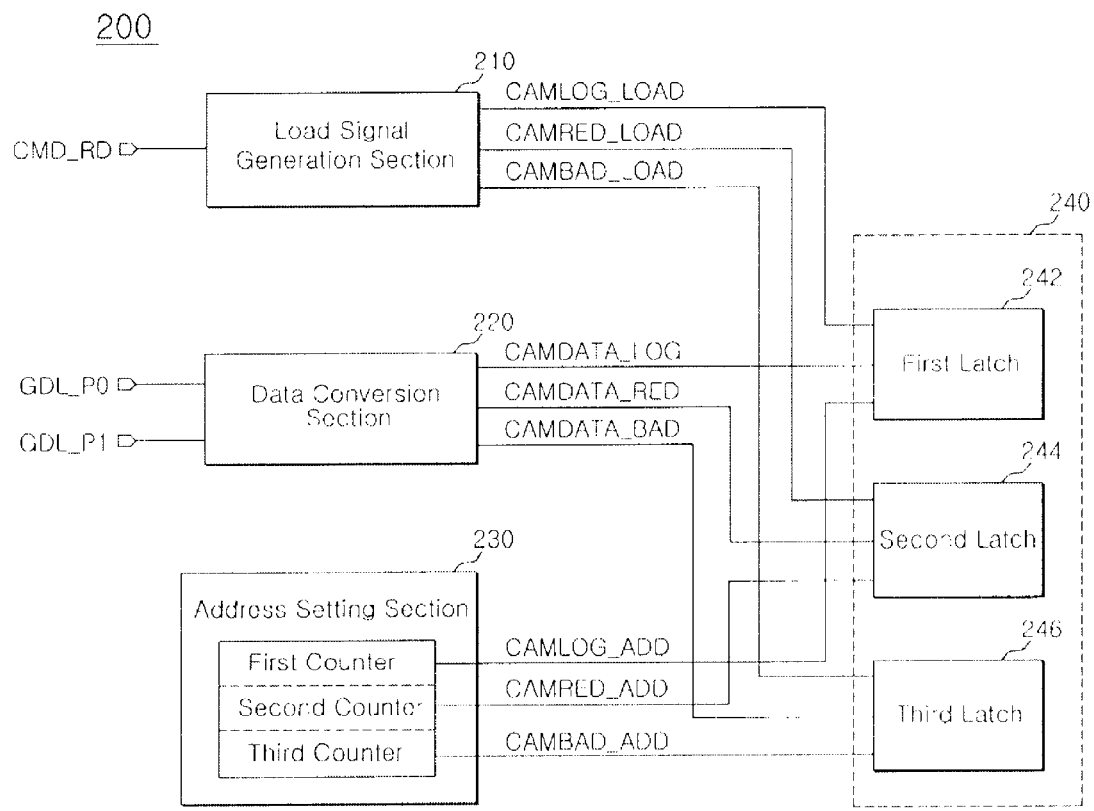
FIG. 3 is a configuration diagram of a CAM data read unit illustrated in FIG. 2.

FIG. 3 is a configuration diagram of the CAM data read unit illustrated in FIG. 2.

Referring to FIG. 3, the CAM data read unit 200 includes a load signal generation section 210, a data conversion section 220, an address setting section 230, and a latch section 240.

The load signal generation section 210 is configured to enable a log data load signal CAMLOG_LOAD, a redundancy address information load signal CAMRED_LOAD, and a bad block information load signal CAMBAD_LOAD, as a CAM data read command CAM_RD is asserted. Such CAM data load signals may be set according to the size of CAM data.

The data conversion section 220 is configured to receive the CAM data stored in designated memory cell blocks of the respective planes of the memory cell array 120 from the data input/output unit 160. That is, the data conversion section 220 receives the CAM log data CAMLOG, the CAM redundancy address information CAMRED, and the CAM bad block information CAMBAD in parallel. In other words, the CAM data are read and received according to the multi-plane method. More specifically, the CAM log data CAMLOG stored in a plane 0 may be received from a first global data line GDL_P0, and the CAM redundancy address information CAMRED and the CAM bad block information CAMBAD stored in a plane 1 may be received from a second global data line GDL_P1. As the CAM data are received from the global data lines GDL_P0 and GDL_P1, the data conversion section 220 converts the CAM data into the form of data which are to be stored in latches, and outputs the converted data as CAM log data CAMDATA_LOG, CAM redundancy address information CAMDATA_RED, and CAM bad block information CAMDATA_BAD, respectively.

The address setting section 230 is configured to set addresses of the latch section 240 in which the respective CAM data converted by the data conversion section 220 are to be stored. In order to store the respective CAM data in parallel, the address setting section 230 may include first to third counters. That is, a latch address CAMLOG_ADD in which the CAM log data CAMDATA_LOG is to be stored may be set through the first counter, a latch address CAMRED_ADD in which the CAM redundancy address information CAMDATA_RED is to be stored may be set through the second counter, and a latch address CAMBAD_ADD in which the CAM bad block information CAMDATA_BAD is to be stored may be set through the third counter.

The latch section 240 includes a first latch 242, a second latch 244, and a third latch 246. The first latch 242 is configured to store the CAM log data CAMDATA_LOG according to log data storage information CAMLOG_ADD, in response to the log data load signal CAMLOG_LOAD. The second latch 244 is configured to store the CAM redundancy address information CAMDATA_RED according to redundancy address storage information CAMRED_ADD, in response to the redundancy address information load signal CAMREAD_ LOAD. The third latch 246 is configured to store the CAM bad block information CAMDATA_BAD according to bad block storage information CAMBAD_ADD, in response to the bad block information load signal CAMBAD_LOAD.

In this embodiment, the CAM log data CAMLOG, the CAM redundancy address information CAMRED, and the CAM bad block information CAMBAD are stored in independent planes of the memory cell array, respectively, or the CAM log data CAMLOG is stored in one plane, and the CAM redundancy address information CAMRED and the CAM bad block information CAMBAD are stored in a separate plane. Then, when a CAM data read command is inputted, the respective CAM data are read according to the multi-plane method.

The log data load signal CAMLOG_LOAD, the redundancy address information load signal CAMRED_LOAD, and the bad block information load signal CAMBAD_LOAD for storing the respective CAM data in the latches are simultaneously asserted during the same time period. Therefore, the CAM log data CAMDATA_LOG, the CAM redundancy address information CAMDATA_RED, and the CAM bad block information CAMDATA_BAD, which are converted into the form of data to be stored in the latches, may be simultaneously stored in the respective latches, that is, stored in parallel.

Figure 4:
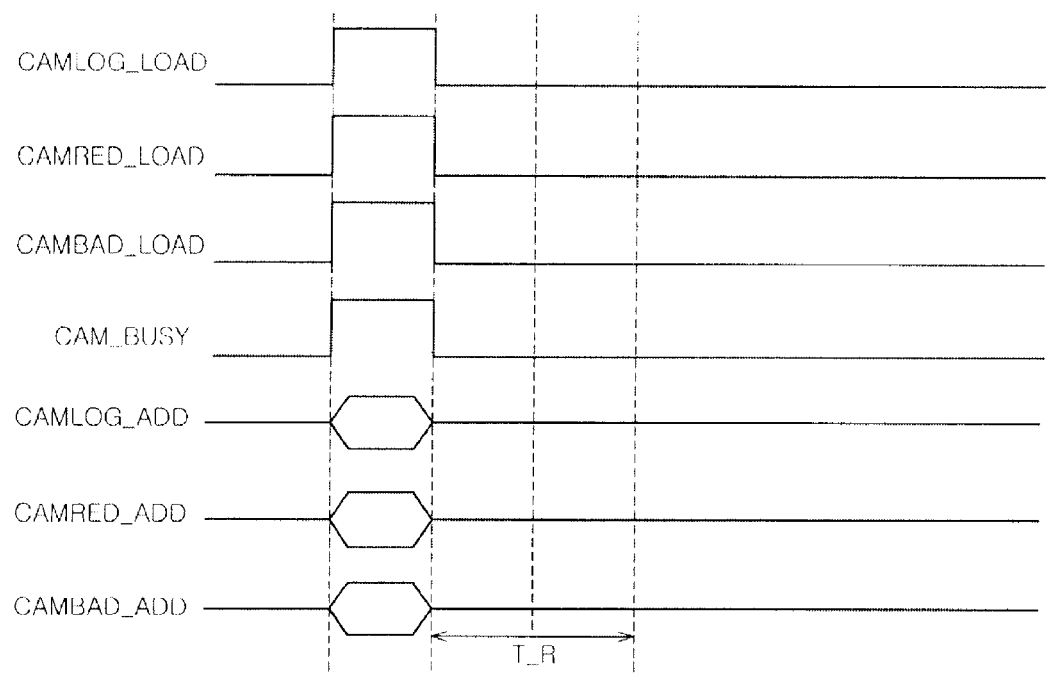
FIG. 4 is a timing diagram explaining a method for reading CAM data according to another embodiment.

FIG. 4 is a timing diagram explaining a method for reading CAM data according to another embodiment.

The log data load signal CAMLOG_LOAD, the redundancy address information load signal CAMRED_LOAD, and the bad block information load signal CAMBAD_LOAD are outputted from the load signal generation section 210 and simultaneously asserted during the same time period. The CAM data read enable signal CAM_BUSY is asserted and applied from the controller 110.

Then, the data conversion section 220 outputs the CAM log data CAMDATA_LOG, the CAM redundancy address information CAMDATA_RED, and the CAM bad block information CAMDATA_BAD, and the respective CAM data are simultaneously stored in the first latch 242, the second latch 244, and the third latch 246 in parallel.

Figure 1:
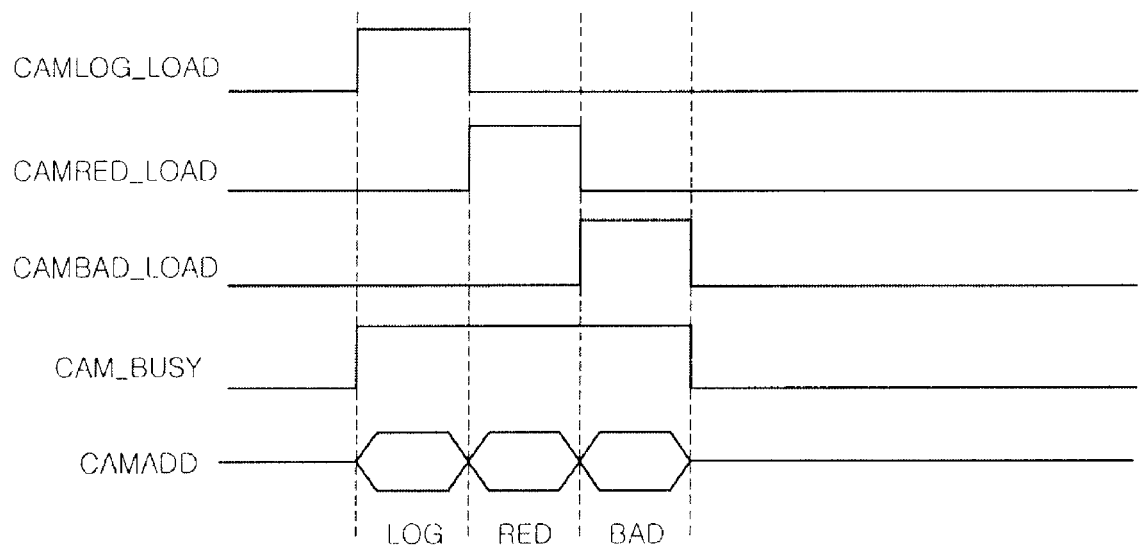
FIG. 1 is a timing diagram explaining a conventional method for reading CAM data.

Referring to FIG. 4, it can be seen that the time required for reading CAM data and storing the CAM data in the latches is significantly reduced (T_R), compared with FIG. 1 in which the CAM log data CAMDATA_LOG, the CAM redundancy address information CAMDATA_RED, and the CAM bad block information CAMDATA_BAD are sequentially stored.

As the time required for reading CAM data is reduced, a time point at which a normal operation of the nonvolatile memory apparatus starts may be advanced. As a result, it is possible to improve the performance of the nonvolatile memory apparatus.

Meanwhile, the CAM data read unit 200 of FIG. 3 may be included in the repair circuit 190, or only the latch section 240 of the CAM data read unit 200 may be included in the repair circuit 190.

While certain embodiments have been described above, it will be understood to those skilled in the art that the embodiments described are by way of example only. Accordingly, the nonvolatile memory apparatus described herein should not be limited based on the described embodiments. Rather, the nonvolatile memory apparatus described herein should only be limited in light of the claims that follow when taken in conjunction with the above description and accompanying drawings.

What is claimed is:

1. A nonvolatile memory apparatus comprising:
a memory cell array comprising a plurality of planes and configured to store a plurality of code addressable memory (CAM) data in independent planes;
a redundancy cell array configured to replace the memory cell array; and
a CAM data read unit configured to read the plurality of CAM data from the respective planes in parallel, in response to a CAM data read command, and store the read data according to simultaneously asserted a plurality of CAM data load signals corresponding to the plurality of CAM data, when the CAM data read command is asserted.

2. The nonvolatile memory apparatus according to claim 1, further comprising a repair circuit configured to output a repair control signal by referring to the CAM data stored in the CAM data read unit,
wherein the CAM data read unit is provided inside the repair circuit.

3. The nonvolatile memory apparatus according to claim 1, wherein the CAM data read unit comprises:
a load signal generation section configured to simultaneously assert the plurality of CAM data load signals;
a data conversion section configured to convert the plurality of CAM data outputted from the memory cell array into latch-level CAM data;
an address setting section configured to output address information on addresses for storing the CAM data converted by the data conversion section; and
a latch section configured to store the plurality of CAM data according to the CAM data load signals and the address information.

4. The nonvolatile memory apparatus according to claim 3, wherein the CAM data load signals comprise a log data load signal, a redundancy address information load signal, and a bad block information load signal.

5. The nonvolatile memory apparatus according to claim 3, wherein the CAM data converted by the data conversion section comprises CAM log data, CAM redundancy address information, and CAM bad block information.

6. The nonvolatile memory apparatus according to claim 5, wherein the CAM data comprise CAM log data, CAM redundancy address information, and CAM bad block information, the CAM log data is stored in a specific plane of the memory cell array, and the CAM redundancy address information and the CAM bad block information are stored in at least one plane other than the plane in which the CAM log data is stored.

7. A repair circuit for a nonvolatile memory apparatus comprising a memory cell array in which a plurality of planes are provided,
wherein a plurality of CAM data are stored in independent planes of the memory cell array, respectively, and
the repair circuit receives a plurality of CAM data from the memory cell array and stores the plurality of CAM data in parallel according to simultaneously asserted a plurality of CAM data load signals corresponding to the plurality of CAM data, when a CAM data read command is asserted.

8. The repair circuit according to claim 7, comprising:
a load signal generation section configured to simultaneously enable the plurality of CAM data load;
a data conversion section configured to convert the plurality of CAM data outputted from the memory cell array into latch-level CAM data;
an address setting section configured to output address information on addresses in which the respective CAM data converted by the data conversion section are to be stored; and
a latch section configured to simultaneously store the plurality of CAM data according to the CAM data load signals and the address information.

9. The repair circuit according to claim 8, wherein the CAM data load signals comprise a log data load signal, a redundancy address information load signal, and a bad block information load signal.

10. The repair circuit according to claim 8, wherein the CAM data converted by the data conversion section comprise CAM log data, CAM redundancy address information, and CAM bad block information.

11. A method for reading CAM data, comprising:
receiving CAM data stored in independent planes in a memory cell array including a plurality of planes;
converting the CAM data into a form of data to be stored in latches;

simultaneously enabling a plurality of CAM data load signals corresponding to the plurality of CAM data; and storing the converted CAM data in latches at the same time.

12. The method according to claim 11, further comprising outputting latch addresses for storing the converted CAM data in the respective latches.

13. The method according to claim 11, wherein the CAM data load signals comprise a log data load signal, a redundancy address information load signal, and a bad block information load signal.

14. The method according to claim 11, wherein the CAM data comprise CAM log data, CAM redundancy address information, CAM bad block information, the CAM log data is received from a specific plane of the memory cell array, and the CAM redundancy address information and the CAM bad block information are received from at least one plane other than the plane in which the CAM log data is stored.

* * * * *